United States Patent
Choi et al.

(10) Patent No.: US 9,917,142 B2
(45) Date of Patent: Mar. 13, 2018

(54) ORGANIC LIGHT EMITTING DISPLAY DEVICE

(71) Applicant: LG Display Co., Ltd., Seoul (KR)

(72) Inventors: MoonJung Choi, Seoul (KR); SungJin Hong, Gyeonggi-do (KR); Ilgi Jeong, Chungcheongbuk-do (KR); JoongSun Yoon, Gyeonggi-do (KR); Hobum Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/154,624

(22) Filed: May 13, 2016

(65) Prior Publication Data

US 2016/0254325 A1    Sep. 1, 2016

Related U.S. Application Data

(63) Continuation of application No. 14/692,966, filed on Apr. 22, 2015, now Pat. No. 9,368,556.

(30) Foreign Application Priority Data

Apr. 23, 2014   (KR) .................. 10-2014-0048968
Mar. 18, 2015   (KR) .................. 10-2015-0037346

(51) Int. Cl.
    *H01L 27/32*    (2006.01)
    *H01L 27/12*    (2006.01)

(52) U.S. Cl.
    CPC ........ *H01L 27/3216* (2013.01); *H01L 27/322* (2013.01); *H01L 27/3213* (2013.01); *H01L 27/3218* (2013.01); *H01L 27/3246* (2013.01); *H01L 27/3262* (2013.01); *H01L 27/3276* (2013.01); *H01L 27/124* (2013.01)

(58) Field of Classification Search
    None
    See application file for complete search history.

(56) References Cited

U.S. PATENT DOCUMENTS 6,366,025 B1    4/2002  Yamada
9,368,556 B2 *  6/2016  Choi .................. H01L 27/322
                        (Continued)

FOREIGN PATENT DOCUMENTS

CN          1841469 A    10/2006
CN        103094307 A     5/2013
                        (Continued)

OTHER PUBLICATIONS

Definition of 'portion' downloaded from URL<http://www.dictionary.com/browse/portion> on May 18, 2017.*

(Continued)

*Primary Examiner* — Joseph Schoenholtz
(74) *Attorney, Agent, or Firm* — Morgan, Lewis & Bockius LLP

(57) ABSTRACT

An organic light emitting display device includes a plurality of pixels defined on a substrate. Each of the plurality of pixels has a plurality of sub-pixels, and each of the plurality of sub-pixels has a light emitting area and a driving area. Widths in a first direction of the driving areas of the plurality of sub-pixels are identical to each other. A size of a light emitting area of a first sub-pixel of the plurality of sub-pixels is greater than a size of a light emitting area of a second sub-pixel of the plurality of sub-pixels.

26 Claims, 6 Drawing Sheets

(56) References Cited

U.S. PATENT DOCUMENTS

| | | | |
|---|---|---|---|
| 2006/0087227 A1 | 4/2006 | Yamanaka | |
| 2006/0114190 A1 | 6/2006 | Fang et al. | |
| 2006/0221092 A1* | 10/2006 | Noguchi | G09G 3/3233 345/589 |
| 2010/0085342 A1* | 4/2010 | Choi | H01L 27/3216 345/211 |
| 2013/0113843 A1 | 5/2013 | Yamazaki | |
| 2013/0161595 A1 | 6/2013 | Kim | |
| 2013/0235289 A1 | 9/2013 | Yamaguchi et al. | |

FOREIGN PATENT DOCUMENTS

| | | |
|---|---|---|
| CN | 103310746 A | 9/2013 |
| EP | 1032045 A2 | 8/2000 |
| JP | 2013186165 A | 9/2013 |
| KR | 20060106757 A | 10/2006 |

OTHER PUBLICATIONS

The First Office Action dated Jun. 14, 2017 from the State Intellectual Property Office of the People's Republic of China in counterpart Chinese application No. 2015-10190808.5.

Spindler, Jeffrey P., Tukaram K. Hatwar, Michael E. Miller, Andrew D. Arnold, Michael J. Murdoch, Paul J. Kane, John E. Ludwicki, Paula J. Alessi, and Steven A. Van Slyke. "System Considerations for RGBW OLED Displays." J. Soc. Inf. Display Journal of the Society for Information Display 14.1 (2006): 37.

Extended European Search Report dated Sep. 21, 2015, for corresponding European Application No. 15164739.3.

Notification of the Second Office Action dated Dec. 1, 2017 from the State Intellectual Property Office of the People's Republic of China in counterpart Chinese application No. 201510190808.5. Note: CN 103310746-A cited therein is already of record.

* cited by examiner

ORGANIC LIGHT EMITTING DISPLAY DEVICE

CROSS-REFERENCE TO RELATED APPLICATIONS

This application is a continuation of U.S. application Ser. No. 14/692,966, filed on Apr. 22, 2015, which claims the benefit of Korean Patent Application No. 10-2014-0048968 filed on Apr. 23, 2014 and Korean Patent Application No. 10-2015-0037346 filed on Mar. 18, 2015, all of which are hereby incorporated by reference.

BACKGROUND OF THE INVENTION

Field of the Invention

The present invention relates to an organic light emitting display device, and more particularly, to an organic light emitting display device having an aperture ratio for each sub-pixel without making a change in driving elements.

Description of the Related Art

An organic light emitting display device (OLED), unlike a liquid crystal display (LCD) device, is a self-light emitting display device that does not need a separate light source, and, thus, the OLED can be made thinner. Further, the OLED has advantages in that it is driven with a low voltage to consume less power. Also, the OLED has excellent color expression ability, a high response time, a wide viewing angle, and a high contrast ratio (CR). Therefore, the OLED has been acknowledged as a next-generation display device.

FIG. 1 is a cross-sectional view provided to describe a typical organic light emitting display device. FIG. 1 illustrates a cross section of a sub-pixel SP of a general bottom-emission organic light emitting display device 100 for convenience in explanation. The bottom-emission organic light emitting display device refers to an organic light emitting display device in which a light emitted from an organic light emitting element is released toward the bottom of the organic light emitting display device. Also, the bottom-emission organic light emitting display device refers to an organic light emitting display device in which a light emitted from an organic light emitting element is released toward the bottom of a substrate on which a thin film transistor for driving the organic light emitting display device is formed.

Referring to FIG. 1, a thin film transistor 120 as a driving element for driving an organic light emitting element 130 is formed in a driving area DA on a substrate 110, and an overcoating layer 151 for planarizing an upper part of the thin film transistor 120 and a color filter 140 is formed. An organic light emitting element 130 including an anode 131 electrically connected with thin film transistor 120, an organic light emitting layer 132, and a cathode 133 is formed on the overcoating layer 151. If the organic light emitting display device 100 is a bottom-emission organic light emitting display device, the anode 131 is formed of a transparent conductive material having a high work function value and the cathode 133 is formed of a reflective metallic material having a low work function value. The organic light emitting layer 132 is an organic light emitting layer for emitting white light. A light emitted from the organic light emitting layer 132 passes through the color filter 140 and is emitted toward the bottom of the substrate 110 on which the thin film transistor 120 is formed. A bank layer 152 is formed on the overcoating layer 151 and defines a light emitting area EA.

Generally, a pixel of an organic light emitting display device includes a plurality of sub-pixels. The respective sub-pixels are configured to emit lights of different colors from each other. Therefore, it is technically important to secure an aperture ratio for each sub-pixel to achieve an optimum luminance for each color. Herein, the aperture ratio refers to a ratio of a light emitting area to a sub-pixel. Optimization of the aperture ratio is closely involved in improving the life of an organic light emitting element.

In the sub-pixel SP of the organic light emitting display device 100 illustrated in FIG. 1, a light emitted from the organic light emitting element 130 cannot be emitted through the driving area DA in which the driving element such as the thin film transistor 120 is formed. Therefore, it is very difficult to secure an aperture ratio in an organic light emitting display device.

A method of reducing the size of a driving area in a sub-pixel may be considered in order to secure an aperture ratio in an organic light emitting display device. However, a driving area in a sub-pixel is optimized by considering the characteristics of an actual product. Therefore, if the number and/or a size of thin film transistors or capacitors disposed in the driving area are reduced to reduce a size of the driving area, reliability of an organic light emitting display device may decrease.

Meanwhile, a method of increasing a size of a pixel may be considered in order to secure an aperture ratio in an organic light emitting display device. However, a size of a pixel in an organic light emitting display device is determined by resolution of the organic light emitting display device. Particularly, in a high-resolution organic light emitting display device, a size of a sub-pixel is very small. Therefore, since the size of a pixel is limited by the resolution of the organic light emitting display device, it is practically impossible to secure an aperture ratio by increasing a size of a pixel.

SUMMARY

Accordingly, the present invention is directed to an organic light emitting display device that substantially obviates one or more of the problems due to limitations and disadvantages of the related art.

Accordingly, an object of the present invention is to provide an organic light emitting display device capable of providing different aperture ratios for respective sub-pixels included in a pixel without making a change in a size of the pixel and a size of a driving area.

Another object of the present invention is to provide an organic light emitting display device with improved reliability and life where a size of a light emitting area of each sub-pixel is provided so as to be suitable for a current required for each sub-pixel.

Yet another object of the present invention is to provide an organic light emitting display device in which a size light emitting area of each sub-pixel is determined by considering efficiency of an organic light emitting element in each sub-pixel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display device comprises a plurality of pixels defined on a substrate, wherein each of the plurality of pixels includes a plurality of sub-pixels, each of the plurality of sub-pixels includes a light emitting area and a driving area, widths in a first direction of the driving areas of the plurality of sub-pixels are identical to each other, and a size of a light emitting area of a first sub-pixel of the plurality of sub-pixels is greater than a size of a light emitting area of a second sub-pixel of the plurality of sub-pixels.

In another aspect, an organic light emitting display device comprises a plurality of first lines extending in a first direction on a substrate; a plurality of second lines intersecting the plurality of first lines and extending in a second direction on the substrate; and a red sub-pixel, a white sub-pixel, a blue sub-pixel, and a green sub-pixel each including a light emitting area and a driving area on the substrate, wherein a driving area of the red sub-pixel, a driving area of the white sub-pixel, a driving area of the blue sub-pixel, and a driving area of the green sub-pixel are identical in width to each other in the first direction, and wherein a size of a light emitting area of the blue sub-pixel and a size of a light emitting area of the white sub-pixel are greater than a size of a light emitting area of the green sub-pixel and a size of a light emitting area of the red sub-pixel, respectively.

In yet another aspect, an organic light emitting display device comprises first lines, second lines, and a plurality of pixels on a substrate, wherein each of the plurality of pixels includes plurality of sub-pixels including a light emitting area and a driving area, sizes of the driving areas of the plurality of sub-pixels are identical to each other, and sizes of the light emitting areas of the plurality of sub-pixels are different from each other due to an slanted portion of at least one of the second lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
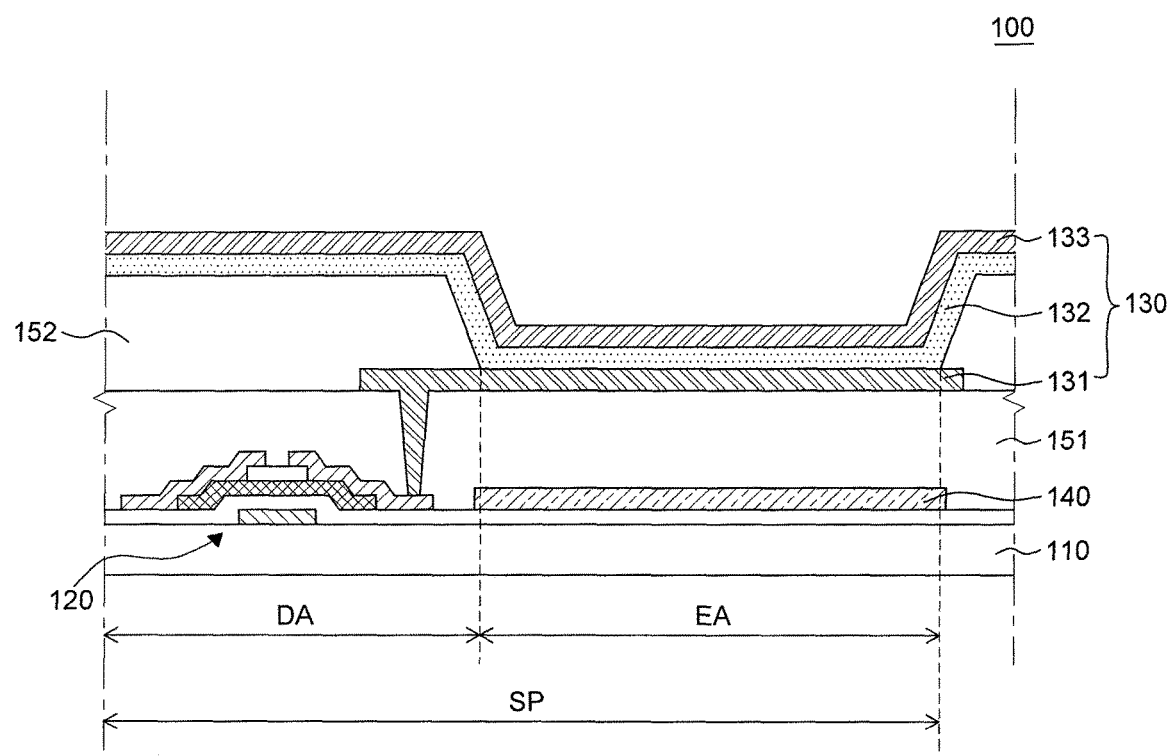
FIG. 1 is a cross-sectional view provided to describe a typical organic light emitting display device.

Advantages and features of the present invention, and methods for accomplishing the same will be more clearly understood from exemplary embodiments described below with reference to the accompanying drawings. However, the present invention is not limited to the following exemplary embodiments but may be implemented in various different forms. The exemplary embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like illustrated in the accompanying drawings for describing the exemplary embodiments of the present invention are merely examples, and the present invention is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present invention.

Throughout the whole specification, the same reference numerals denote the same elements.

Since size and thickness of each component illustrated in the drawings are represented for convenience in explanation, the present invention is not necessarily limited to the illustrated size and thickness of each component.

The features of various embodiments of the present invention can be partially or entirely bonded to or combined with each other and can be interlocked and operated in technically various ways as can be fully understood by a person having ordinary skill in the art, and the embodiments can be carried out independently of or in association with each other.

Various exemplary embodiments of the present invention will be described in detail with reference to the accompanying drawings.

Figure 2:
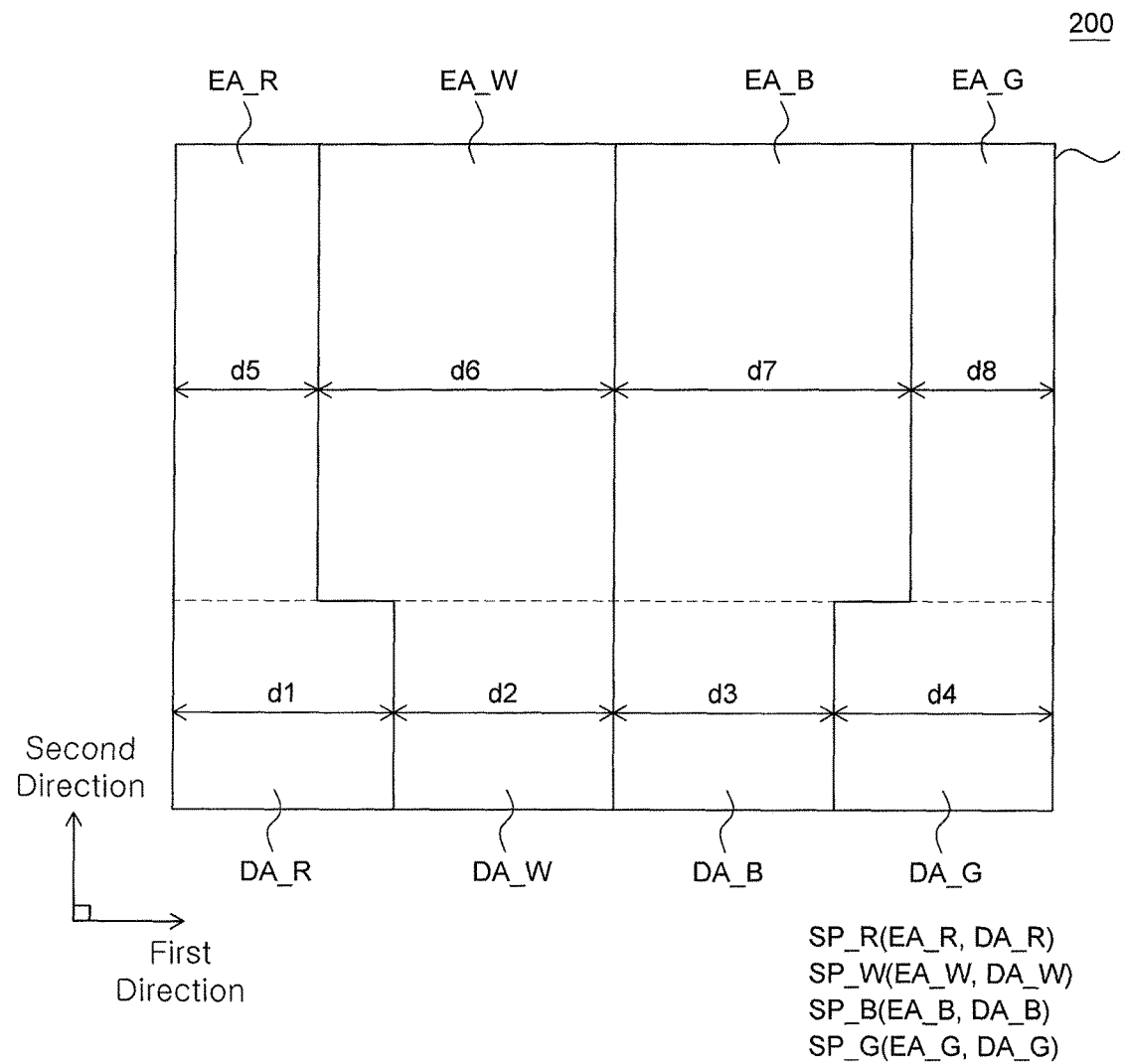
FIG. 2 is a schematic diagram provided to describe a light emitting area and a driving area in each of a plurality of sub-pixels of an organic light emitting display device according to an exemplary embodiment of the present invention.

FIG. 2 is a schematic diagram provided to describe a light emitting area and a driving area in each of a plurality of sub-pixels of an organic light emitting display device according to an exemplary embodiment of the present invention. For convenience in explanation, FIG. 2 schematically illustrates a pixel P, sub-pixels SP_R, SP_W, SP_B, and SP_G, and light emitting areas EA_R, EA_W, EA_B, and EA_G and driving areas DA_R, DA_W, DA_B, and DA_G of the respective sub-pixels SP_R, SP_W, SP_B, and SP_G. In FIG. 2, borders of the sub-pixels SP_R, SP_W, SP_B, and SP_G are indicated by solid lines, and borders between the light emitting areas EA_R, EA_W, EA_B, and EA_G and the driving areas DA_R, DA_W, DA_B, and DA_G within the respective sub-pixels SP_R, SP_W, SP_B, and SP_G are indicated by dotted lines.

An organic light emitting display device 200 includes a plurality of pixels P defined on a substrate. Specifically, each pixel P has a square shape and may have a rectangular shape. A size of the pixel P is determined by characteristics of a product such as a screen size and resolution of the organic light emitting display device 200. In FIG. 2, only one pixel of the plurality of pixels P of the organic light emitting display device 200 is illustrated for convenience in explanation.

Each of the plurality of pixels P includes a plurality of sub-pixels SP_R, SP_W, SP_B, and SP_G. The plurality of sub-pixels SP_R, SP_W, SP_B, and SP_G include a red sub-pixel SP_R for emitting a red light, a white sub-pixel SP_W for emitting a white light, a blue sub-pixel SP_B for emitting a blue light, and a green sub-pixel SP_G for emitting a green light. Since the organic light emitting display device 200 according to the exemplary embodiment of the present invention includes the white sub-pixel SP_W for emitting a white light in addition to the red sub-pixel SP_R, the green sub-pixel SP_G, and the blue sub-pixel SP_B, luminance of the organic light emitting display device 200 can be improved.

The plurality of sub-pixels SP_R, SP_W, SP_B, and SP_G within the pixel P are disposed in sequence in a first direction. That is, as illustrated in FIG. 2, the white sub-pixel SP_W is disposed on one side of the red sub-pixel SP_R so as to be adjacent to each other in the first direction. The blue sub-pixel SP_B is disposed on one side of the white sub-pixel SP_W so as to be adjacent to each other in the first direction, and the green sub-pixel SP_G is disposed on one side of the blue sub-pixel SP_B so as to be adjacent to each other in the first direction. The first direction may be an X-axis direction as illustrated in FIG. 2. Although FIG. 2 illustrates that the red sub-pixel SP_R, the white sub-pixel SP_W, the blue sub-pixel SP_B, and the sub-pixel SP_G are disposed in sequence, the present invention is not limited thereto. An arrangement sequence of the plurality of sub-pixels SP_R, SP_W, SP_B, and SP_G may be changed in various ways.

Referring to FIG. 2, each of the plurality of sub-pixels SP_R, SP_W, SP_B, and SP_G have a shape extending in a second direction. In other words, as illustrated in FIG. 2, each of the red sub-pixel SP_R, the white sub-pixel SP_W, the blue sub-pixel SP_B, and the green sub-pixel SP_G have a shape elongated in the second direction from one side of the pixel P. The second direction refers to a different direction from the first direction. For example, the second direction may be a Y-axis direction perpendicular to the first direction as illustrated in FIG. 2, but is not limited thereto.

The plurality of sub-pixels SP_R, SP_W, SP_B, and SP_G respectively include light emitting areas EA_R, EA_W, EA_B, and EA_G in which organic light emitting elements are disposed to emit lights to the outside of the organic light emitting display device 200 and driving areas DA_R, DA_W, DA_B, and DA_G in which driving elements such as thin film transistors for driving the organic light emitting elements are disposed. In the organic light emitting display device 200 according to the exemplary embodiment of the present invention, the light emitting areas EA_R, EA_W, EA_B, and EA_G and the driving areas DA_R, DA_W, DA_B, and DA_G of the respective sub-pixels SP_R, SP_W, SP_B, and SP_G are separate areas each other so as not to be overlapped. FIG. 2 illustrates that the light emitting areas EA_R, EA_W, EA_B, and EA_G and the driving areas DA_R, DA_W, DA_B, and DA_G of the respective sub-pixels SP_R, SP_W, SP_B, and SP_G have rectangular shapes for convenience in explanation, but shapes of the light emitting areas EA_R, EA_W, EA_B, and EA_G and the driving areas DA_R, DA_W, DA_B, and DA_G are not limited thereto.

Sizes of the driving areas DA_R, DA_W, DA_B, and DA_G of the respective sub-pixels SP_R, SP_W, SP_B, and SP_G are determined on the basis of various characteristics of a product such as resolution and a current required for each sub-pixel of the organic light emitting display device 200 and characteristics of the organic light emitting elements. For example, a size of the pixel P may be first determined on the basis of the resolution of the organic light emitting display device 200, and sizes of the driving areas DA_R, DA_W, DA_B, and DA_G of the respective sub-pixels SP_R, SP_W, SP_B, and SP_G may be determined on the basis of a current required for each sub-pixel for driving each of the sub-pixels SP_R, SP_W, SP_B, and SP_G included in the pixel P. Then, the sizes of the driving areas DA_R, DA_W, DA_B, and DA_G can be optimized on the basis of the characteristics of the organic light emitting elements disposed on the respective sub-pixels SP_R, SP_W, SP_B, and SP_G. The above-described determination method is just one example, but the present invention is not limited thereto.

Referring to FIG. 2, first directional widths d1, d2, d3, and d4 of the driving areas DA_R, DA_W, DA_B, and DA_G of the respective sub-pixels SP_R, SP_W, SP_B, and SP_G are identical to each other. That is, the first directional width d1 of the driving area DA_R of the red sub-pixel SP_R, the first directional width d2 of the driving area DA_W of the white sub-pixel SP_W, the first directional width d3 of the driving area DA_B of the blue sub-pixel SP_B, and the first directional width d4 of the driving area DA_G of the green sub-pixel SP_G are identical to each other. Therefore, as illustrated in FIG. 2, if the sizes of the driving areas DA_R, DA_W, DA_B, and DA_G of the respective sub-pixels SP_R, SP_W, SP_B, and SP_G are identical to each other, second directional widths of the driving areas DA_R, DA_W, DA_B, and DA_G of the respective sub-pixels SP_R, SP_W, SP_B, and SP_G may also be identical to each other. Further, if the sizes of the driving areas DA_R, DA_W, DA_B, and DA_G of the respective sub-pixels SP_R, SP_W, SP_B, and SP_G are different from each other, the second directional widths of the driving areas DA_R, DA_W, DA_B, and DA_G of the respective sub-pixels SP_R, SP_W, SP_B, and SP_G may be different from each other.

In the present specification, being identical in width between two components means not only that the two components have exactly the same width, but also that the two components can be considered having substantially the same width although they do not have exactly the same width.

A size of a light emitting area of one sub-pixel of sub-pixels SP_R, SP_W, SP_B, and SP_G adjacent to each other is greater than a size of a light emitting area of the other sub-pixel. Herein, the white sub-pixel SP_W or the blue sub-pixel SP_B has a relatively large light emitting area, and the red sub-pixel SP_R or the green sub-pixel SP_G has a relatively small light emitting area. In the organic light emitting display device 200 according to the exemplary embodiment of the present invention, in order to improve the luminance of the light emitting area EA_B of the blue sub-pixel SP_B having a relatively short life as compared with the other sub-pixels SP_R and SP_G and the overall luminance of the organic light emitting display device 200, a size of the light emitting area EA_W of the white sub-pixel SP_W needs to be set greater than sizes of the light emitting areas EA_R and EA_G of the other sub-pixels SP_R and SP_G, and, thus, life and luminance of the organic light emitting display device 200 can be improved.

Referring to FIG. 2, a size of the light emitting area EA_W of the white sub-pixel SP_W is greater than a size of the light emitting area EA_R of the red sub-pixel SP_R adjacent to the white sub-pixel SP_W. In particular, the light emitting area EA_W of the white sub-pixel SP_W includes a portion extending into the red sub-pixel SP_R. Therefore, a first directional width d6 of the light emitting area EA_W of the white sub-pixel SP_W is greater than a first directional width d5 of the light emitting area EA_R of the red sub-pixel SP_R. Likewise, a size of the light emitting area EA_B of the blue sub-pixel SP_B is greater than a size of the light emitting area EA_G of the green sub-pixel SP_G adjacent to the blue sub-pixel SP_B. Also, the light emitting area EA_B of the blue sub-pixel SP_B includes a portion extending into the green sub-pixel SP_G. Therefore, a first directional width d7 of the light emitting area EA_B of the blue sub-pixel SP_B is greater than a first directional width d8 of the light emitting area EA_G of the green sub-pixel SP_G.

Generally, a size of a pixel in an organic light emitting display device is determined by resolution of the organic light emitting display device. That is, an organic light emitting display device having a high resolution is formed of small-sized pixels than an organic light emitting display device having a low resolution, and each of the pixels is formed of plurality of sub-pixels. The plurality of sub-pixels is configured as an area for emitting lights of specific colors. Thus, it is important to achieve an optimum luminance for a color of a light emitted from each sub-pixel. Particularly, it is important to secure an aperture ratio for each sub-pixel. However, as described above, if an organic light emitting display device is designed as an organic light emitting display device having a high resolution, a pixel itself is small, and, thus, it is difficult to secure an aperture ratio for each sub-pixel in the pixel. Particularly, in the sub-pixels SP_R, SP_W, SP_B, and SP_G of the organic light emitting display device 200 according to the exemplary embodiment of the present invention, the driving areas DA_R, DA_W, DA_B, and DA_G for driving elements such as thin film transistors disposed on the substrate of the respective sub-pixels SP_R, SP_W, SP_B, and SP_G cannot emit lights. Thus, it is difficult to secure an aperture ratio in the organic light emitting display device 200. Further, generally, a driving area of a sub-pixel is optimized to work effectively in a product. Thus, reducing the size of the driving area of the sub-pixel negatively affects the performance and reliability of an organic light emitting element. Therefore, in a pixel having a limited size, it is difficult to secure an aperture ratio of each sub-pixel without making a change in a size of the pixel and a size of a driving area of each optimally designed sub-pixel. That is, it is difficult to have desired resolution by having a suitable size of a pixel to have, and, thus, there is a limit in securing a desired aperture ratio suitable for each sub-pixel. Therefore, in the present invention, a shape of a line is changed without changing a size of a driving area in a sub-pixel, thereby securing a desired aperture ratio for each sub-pixel.

In the organic light emitting display device 200 according to the exemplary embodiment of the present invention, optimum aperture ratios for the respective sub-pixels SP_R, SP_W, SP_B, and SP_G are provided by changing only sizes of the light emitting areas EA_R, EA_W, EA_B, and EA_G of the respective sub-pixels SP_R, SP_W, SP_B, and SP_G without changing a size of the optimally designed pixel P or sizes of the driving areas DA_R, DA_W, DA_B, and DA_G of the respective sub-pixels SP_R, SP_W, SP_B, and SP_G. To be specific, in a state where the width d1 of the driving area DA_R of the red sub-pixel SP_R, the width d2 of the driving area DA_W of the white sub-pixel SP_W, the width d3 of the driving area DA_B of the blue sub-pixel SP_B, and the width d4 of the driving area DA_G of the green sub-pixel SP_G are maintained identical to each other, the width d6 of the light emitting area EA_W of the white sub-pixel SP_W and the width d7 of the light emitting area EA_B of the blue sub-pixel SP_B may be set to be greater than the width d5 of the light emitting area EA_R of the red sub-pixel SP_R and the width d8 of the light emitting area EA_G of the green sub-pixel SP_G. Thus, in the pixel P with the limited size, the width d6 of the light emitting area EA_W of the white sub-pixel SP_W and the width d7 of the light emitting area EA_B of the blue sub-pixel SP_B can be increased to improve life and luminance of the organic light emitting display device 200 without changing sizes of the driving areas DA_R, DA_W, DA_B, and DA_G of the respective sub-pixels SP_R, SP_W, SP_B, and SP_G. Therefore, life and luminance of an organic light emitting display device can be improved without deteriorating the reliability of the organic light emitting display device.

Figure 3:
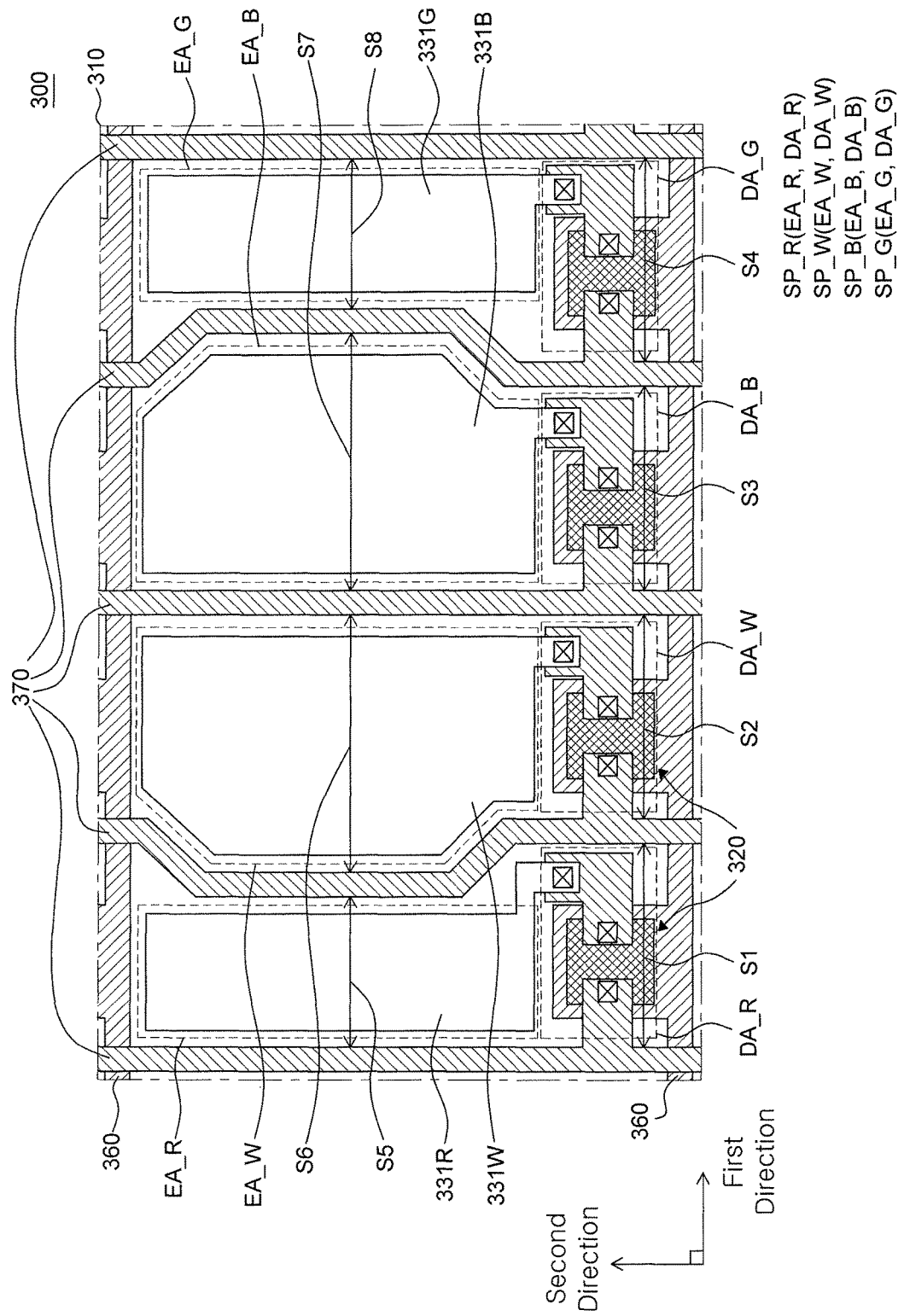
FIGS. 3 to 6 are plane views provided to describe organic light emitting display devices according to various exemplary embodiments of the present invention.

FIG. 3 is a plane view provided to describe an organic light emitting display device according to an exemplary embodiment of the present invention. Referring to FIG. 3, an organic light emitting display device 300 includes a plurality of first lines 360 disposed on a substrate 310, a plurality of second lines 370, a red sub-pixel SP_R, a white sub-pixel SP_W, a blue sub-pixel SP_B, and a green sub-pixel SP_G. FIG. 3 illustrates only driving thin film transistors 320 without a switching thin film transistor or a capacitor among various driving elements for driving an organic light emitting element for convenience in explanation.

The plurality of first lines 360 are disposed so as to extend in a first direction on the substrate 310. The first direction may be in X-axis direction as illustrated in FIG. 3. The first lines 360 are configured as scan lines for applying scan signals to the thin film transistors 320 disposed in a driving area DA_R of the red sub-pixel SP_R, a driving area DA_W of the white sub-pixel SP_W, a driving area DA_B of the blue sub-pixel SP_B, and a driving area DA_G of the green sub-pixel SP_G, respectively.

The plurality of second lines 370 are disposed so as to extend in a second direction on the substrate 310, and intersect the plurality of first lines 360 extended in the first direction. For example, the second direction may be in a Y-axis direction perpendicular to the first direction as illustrated in FIG. 3, but is not limited thereto. The first lines 360 are configured as lines for applying data signals to the thin film transistors 320 disposed in the driving area DA_R of the red sub-pixel SP_R, the driving area DA_W of the white sub-pixel SP_W, the driving area DA_B of the blue sub-pixel SP_B, and the driving area DA_G of the green sub-pixel SP_G, respectively.

The Plurality of pixels are defined on the substrate 310, and they include the red sub-pixel SP_R, the white sub-pixel SP_W, the blue sub-pixel SP_B, and the sub-pixel SP_G as illustrated in FIG. 3. The red sub-pixel SP_R, the white sub-pixel SP_W, the blue sub-pixel SP_B, and the sub-pixel SP_G are defined by the first lines 360 and the second lines 370. That is, closed areas on the substrate 310 defined by the two first lines 360 extended in the first direction and the two second lines 370 extended in the second direction correspond to the respective sub-pixels SP_R, SP_W, SP_B, and SP_G. The red sub-pixel SP_R, the white sub-pixel SP_W, the blue sub-pixel SP_B, and the sub-pixel SP_G may be defined by the first lines 360 and the second lines 370, but the present invention is not limited thereto. A sub-pixel may also be included when the first lines 360 or the second lines 370 share at least one sub-pixel.

The red sub-pixel SP_R, the white sub-pixel SP_W, the blue sub-pixel SP_B, and the sub-pixel SP_G respectively include the light emitting areas EA_R, EA_W, EA_B, and EA_G in which organic the light emitting elements are disposed to emit lights to the outside of the organic light emitting display device 300 and the driving areas DA_R, DA_W, DA_B, and DA_G in which driving elements such as the thin film transistors 320 for driving the organic light emitting elements are disposed.

The organic light emitting elements respectively disposed in the light emitting areas EA_R, EA_W, EA_B, and EA_G of the red sub-pixel SP_R, the white sub-pixel SP_W, the blue sub-pixel SP_B, and the sub-pixel SP_G include anodes 331R, 331W, 331B, and 331G, organic light emitting layers, and cathodes, respectively. If the organic light emitting display device 300 is a bottom-emission organic light emitting display device, the anodes 331R, 331W, 331B, and 331G are formed of a transparent conductive material having a high work function value and the cathodes are formed of a reflective metallic material having a low work function value. The organic light emitting layers are organic light emitting layers for emitting white lights. Lights emitted from the organic light emitting layers pass through color filters and are emitted toward the bottom of the substrate 310 on which the thin film transistors 320 is formed. However, a light emitted from the organic light emitting layer of the white sub-pixel SP_W does not pass through the color filter and is emitted toward the bottom of the substrate 310. In FIG. 3, illustration of the organic light emitting layers, the cathodes, and the color filters is omitted for convenience in explanation, but only the anodes 331R, 331W, 331B, and 331G disposed on the respective sub-pixels SP_R, SP_W, SP_B, and SP_G are illustrated.

Although not illustrated in the drawing, the organic light emitting layer may be formed of two light emitting layers including a blue light emitting layer and a yellow-green light emitting layer so as to emit a white light. In this case, the blue sub-pixel SP_B or the white sub-pixel SP_W may be configured to have a shape extending into the red sub-pixel SP_R or the green sub-pixel SP_G. Therefore, a size of the light emitting area EA_B of the blue sub-pixel SP_B or a size of the light emitting area EA_W of the white sub-pixel SP_W may be greater than a size of the light emitting area EA_R of the red sub-pixel SP_R or a size of the light emitting area EA_G of the green sub-pixel SP_G. Thus, efficiency and luminance of the blue sub-pixel SP_B can be improved. Otherwise, in order to further improve efficiency of the blue sub-pixel SP_B, a size of the light emitting area EA_B of the blue sub-pixel SP_B can be much greater than a size of the light emitting area EA_W of the white sub-pixel SP_W. Herein, the blue light emitting layer may include a blue light emitting layer, a sky blue light emitting layer, and a deep blue light emitting layer. Further, the blue light emitting layer may have an emission wavelength in a range of 440 nm to 480 nm. The yellow-green light emitting layer may have an emission wavelength in a range of 510 nm to 580 nm.

Further, the organic light emitting layer may be formed of three light emitting layers including a blue light emitting layer a yellow-green light emitting layer, and a blue light emitting layer so as to emit a white light. In this case, the organic light emitting layer includes two blue light emitting layers, and, thus, both emission efficiency of the blue light emitting layer and life of the blue light emitting layers can be improved. In this case, the blue sub-pixel SP_B or the white sub-pixel SP_W may be configured to have a shape extending into the red sub-pixel SP_R or the green sub-pixel SP_G. Therefore, a size of the light emitting area EA_B of the blue sub-pixel SP_B or a size of the light emitting area EA_W of the white sub-pixel SP_W may be greater than a size of the light emitting area EA_R of the red sub-pixel SP_R or a size of the light emitting area EA_G of the green sub-pixel SP_G. Otherwise, the white sub-pixel SP_W may be configured to have a shape extending into the blue sub-pixel SP_B, and the blue sub-pixel SP_B may be configured to have a shape extending into the green sub-pixel. Therefore, a size of the light emitting area EA_B of the blue sub-pixel SP_B or a size of the light emitting area EA_W of the white sub-pixel SP_W may be greater than a size of the light emitting area EA_R of the red sub-pixel SP_R or a size of the light emitting area EA_G of the green sub-pixel SP_G. Otherwise, efficiency or luminance of the white sub-pixel SP_W can be improved by setting a size of the white sub-pixel SP_W to be greater than that of the blue sub-pixel SP_B. Alternatively, efficiency or luminance of the red sub-pixel SP_R can be further improved by setting a size of the red sub-pixel SP_R to be greater than that of the green sub-pixel SP_G. Herein, the blue light emitting layer may include a blue light emitting layer, a sky blue light emitting layer, and a deep blue light emitting layer. Further, the blue light emitting layer may have an emission wavelength in a range of 440 nm to 480 nm. Further, the yellow-green light emitting layer may have an emission wavelength in a range of 510 nm to 580 nm. Furthermore, a sequence of the organic light emitting layers can be determined on the basis of the characteristic or a structure of the product. For example, if the organic light emitting layer is formed of two light emitting layers including a blue light emitting layer and a yellow-green light emitting layer, the blue light emitting layer may be configured to be close to an anode or the yellow-green light emitting layer may be configured to be close to an anode. Further, if the organic light emitting layer is formed of three light emitting layers including a blue light emitting layer, a yellow-green light emitting layer, and a blue light emitting layer, the blue light emitting layer, the yellow-green light emitting layer, and the blue light emitting layer may be disposed in sequence on an anode. Otherwise, the blue light emitting layer, the blue light emitting layer, and the yellow-green light emitting layer may be disposed in sequence on an anode. Alternatively, the yellow-green light emitting layer, the blue layer, and the blue layer may be disposed in sequence on an anode.

In order to improve emission efficiency of a red sub-pixel, a red light emitting layer may be further formed. If there are two light emitting layers including a blue light emitting layer and a yellow-green light emitting layer, a red light emitting layer may be further formed at the blue light emitting layer. If the blue light emitting layer is formed so as to be closer to the anode than the yellow-green light emitting layer, a red light emitting layer may be formed on the blue light emitting layer, which may be more advantageous in improving color reproduction ratio or color purity of the organic light emitting display device. If the yellow-green light emitting layer is formed so as to be closer to the anode than to the blue light emitting layer, a red light emitting layer may be formed under the blue light emitting layer, which may be more advantageous in improving the color reproduction ratio or color purity of the organic light emitting display device.

Further, a red light emitting layer may be further formed on the yellow-green light emitting layer. If a red light emitting layer is further formed, a suitable position of the red light emitting layer may vary depending on an effect on improving the color reproduction ratio or color purity of the organic light emitting display device.

Further, even if there are three light emitting layers including a blue light emitting layer, a yellow-green light emitting layer, and a blue light emitting layer, a red light emitting layer may be further formed at the blue light emitting layer. If a red light emitting layer is further formed at the blue light emitting layer closer to the anode, the red light emitting layer may be formed on the blue light emitting layer, which may be more advantageous in improving the color reproduction ratio or color purity of the organic light emitting display device. If a red light emitting layer is further formed at the blue light emitting layer closer to the cathode, the red light emitting layer may be formed under the blue light emitting layer, which may be more advantageous to improving the ratio of color reproduction or color purity of the organic light emitting display device. Further, if a red light emitting layer is further formed at the yellow-green light emitting layer, the red light emitting layer may be formed under the yellow-green light emitting layer, which may be more advantageous to improving the color reproduction ratio or color purity. Furthermore, if the blue light emitting layer, the blue light emitting layer, and the yellow-green light emitting layer are formed in sequence on the anode, a red light emitting layer may be formed under the blue light emitting layer or the yellow-green light emitting layer. Further, if the yellow-green light emitting layer, the blue light emitting layer, and the light emitting layer are formed in sequence on the anode, a red light emitting layer may be formed under the yellow-green light emitting layer. Otherwise, a red light emitting layer may be formed on the blue light emitting layer closer to the anode. Alternatively, a red light emitting layer may be formed on the blue light emitting layer closer to the cathode. That is, if a red light emitting layer is added, the red light emitting layer may be disposed at a position suitable for improving the color reproduction ratio or color purity of the organic light emitting display device, and a position of the red light emitting layer may be determined in various ways.

Therefore, regardless of light emitting layers constituting organic light emitting layers, the present invention can provide an organic light emitting display device improved in life by increasing a size of a light emitting area of a sub-pixel having a short life or a low efficiency as compared with other sub-pixels.

Further, light emitting layers constituting organic light emitting layers may be configured in various ways depending on characteristics of an organic light emitting display device. Therefore, the present invention can provide an organic light emitting display device improved in life or other characteristics by increasing a size of a light emitting area of a sub-pixel having a short life and inferior characteristics of an organic light emitting display device as compared with other sub-pixels in consideration of characteristics of an organic light emitting display device, such as an aperture ratio, life, luminance, reliability, color reproduction ratio, and color purity. Bank layers can define the light emitting areas EA_R, EA_W, EA_B, and EA_G of the sub-pixels SP_R, SP_W, SP_B, and SP_G, respectively. That is, in the respective sub-pixels SP_R, SP_W, SP_B, and SP_G, the areas covered by the bank layers can be defined as the driving areas DA_R, DA_W, DA_B, and DA_G and the areas which are not covered by the bank layers can be defined as the light emitting areas EA_R, EA_W, EA_B, and EA_G. Since FIG. 3 is a plane view, the bank layers are not illustrated in FIG. 3, and the light emitting areas EA_R, EA_W, EA_B, and EA_G and the driving areas DA_R, DA_W, DA_B, and DA_G are schematically indicated by dotted lines.

Referring to FIG. 3, a space S1 between the second lines 370 defining the driving area DA_R of the red sub-pixel SP_R, a space S2 between the second lines 370 defining the driving area DA_W of the white sub-pixel SP_W, a space S3 between the second lines 370 defining the driving area DA_B of the blue sub-pixel SP_B, and a space S4 between the second lines 370 defining the driving area DA_G of the red sub-pixel SP_G are identical to each other. That is, the second lines 370 defining the driving areas DA_R, DA_W, DA_B, and DA_G of the respective sub-pixels SP_R, SP_W, SP_B, and SP_G are equally spaced apart. Therefore, the respective sub-pixels SP_R, SP_W, SP_B, and SP_G are defined by the second lines 370, and, thus, first directional widths of the driving area DA_R of the red sub-pixel SP_R, the driving area DA_W of the white sub-pixel SP_W, the driving area DA_B of the blue sub-pixel SP_B, and the driving area DA_G of the red sub-pixel SP_G are identical to each other.

A maximum space S6 between the second lines 370 defining the light emitting area EA_W of the white sub-pixel SP_W is greater than a minimum space S5 between the second lines 370 defining the light emitting area EA_R of the red sub-pixel SP_R adjacent to the white sub-pixel SP_W. That is, the second line which defines the light emitting area EA_W of the white sub-pixel SP_W that also defines the light emitting area EA_R of the red sub-pixel SP_R includes a slanted portion with respect to the first direction and the second direction such that the light emitting area EA_W of the white sub-pixel SP_W includes a portion extending into the red sub-pixel SP_R.

Further, a maximum space S7 between the second lines 370 defining the light emitting area EA_B of the blue sub-pixel SP_B is greater than a minimum space S8 between the second lines 370 defining the light emitting area EA_G of the green sub-pixel SP_G adjacent to the blue sub-pixel SP_B. That is, the second line which defines the light emitting area EA_B of the white blue sub-pixel SP_B that also defines the light emitting area EA_G of the green sub-pixel SP_G includes a slanted portion with respect to the first direction and the second direction such that the light emitting area EA_B of the blue sub-pixel SP_B includes a portion extending into the green sub-pixel SP_G.

As described above, the second lines 370 defining the driving areas DA_R, DA_W, DA_B, and DA_G of the respective sub-pixels SP_R, SP_W, SP_B, and SP_G are equally spaced apart, and the light emitting area EA_W of the white sub-pixel SP_W and the light emitting area EA_B of the blue sub-pixel SP_B include the portions extending into the red sub-pixel SP_R and the green sub-pixel SP_G, respectively. Therefore, the space S3 between the second lines 370 defining the driving area DA_B of the blue sub-pixel SP_B is smaller than the maximum space S7 between the second lines 370 defining the light emitting area EA_B of the blue sub-pixel SP_B. The space S2 between the second lines 370 defining the driving area DA_W of the white sub-pixel SP_W is smaller than the maximum space S6 between the second lines 370 defining the light emitting area EA_W of the white sub-pixel SP_W. In the same principle, the space S1 between the second lines 370 defining the driving area DA_R of the red sub-pixel SP_R is greater than the minimum space S5 between the second lines 370 defining the light emitting area EA_R of the red sub-pixel SP_R. The space S4 between the second lines 370 defining the driving area DA_G of the green sub-pixel SP_G is greater than the minimum space S8 between the second lines 370 defining the light emitting area EA_G of the green sub-pixel SP_G.

Referring to FIG. 3, a size of the light emitting area EA_B of the blue sub-pixel SP_B and a size of the light emitting area EA_W of the white sub-pixel SP_W are greater than a size of the light emitting area EA_G of the green sub-pixel SP_G and a size of the light emitting area EA_R of the red sub-pixel SP_R, respectively. This is because the light emitting area EA_B of the blue sub-pixel SP_B and the light emitting area EA_W of the white sub-pixel SP_W include the areas extending into the red sub-pixel SP_R and the green sub-pixel SP_G, respectively.

In the organic light emitting display device 300 according to the exemplary embodiment of the present invention, it is possible to secure desired sizes of the light emitting areas EA_R, EA_W, EA_B, and EA_G of the respective sub-pixels SP_R, SP_W, SP_B, and SP_G by changing only the lines defining the light emitting areas EA_R, EA_W, EA_B, and EA_G of the respective sub-pixels SP_R, SP_W, SP_B, and SP_G without changing a size of the optimally designed pixel P or sizes of the driving areas DA_R, DA_W, DA_B, and DA_G of the respective sub-pixels SP_R, SP_W, SP_B, and SP_G. That is, as illustrated in FIG. 3, a size of the light emitting area EA_W of the white sub-pixel SP_W is secured by allowing the second line 370 disposed between the light emitting area EA_W of the white sub-pixel SP_W and the light emitting area EA_R of the red sub-pixel SP_R to include an slanted portion. A Size of the light emitting area EA_B of the blue sub-pixel SP_B is secured by allowing the second line 370 disposed between the light emitting area EA_B of the blue sub-pixel SP_B and the light emitting area EA_G of the green sub-pixel SP_G to include a slanted portion. Therefore, a size of the light emitting area EA_W of the white sub-pixel SP_W can be increased without changing the driving areas DA_R, DA_W, DA_B, and DA_G of the respective sub-pixels SP_R, SP_W, SP_B, and SP_G, and, thus, overall luminance of the organic light emitting display device 300 can be improved. Further, a size of the light emitting area EA_B of the blue sub-pixel SP_B can be increased without changing the driving areas DA_R, DA_W, DA_B, and DA_G of the respective sub-pixels SP_R, SP_W, SP_B, and SP_G, and, thus, life of the blue sub-pixel SP_B having a shorter life than that of other sub-pixels can be improved. Otherwise, by increasing a size of a sub-pixel having a shorter life than the other sub-pixels depending on a structure or characteristics of an element, life of the sub-pixel having a shorter life can be improved.

In some exemplary embodiments, a size of the light emitting area EA_W of the white sub-pixel SP_W may be greater than a size of the light emitting area EA_R of the red sub-pixel SP_R, a size of the light emitting area EA_B of the blue sub-pixel SP_B, and a size of the light emitting area EA_G of the green sub-pixel SP_G. That is, by setting the light emitting area EA_W of the white sub-pixel SP_W to have a greater size than that of the light emitting areas EA_R, EA_G, and EA_B of the other sub-pixels SP_R, SP_G, and SP_B, luminance of the organic light emitting display device 300 can be further improved.

In some exemplary embodiments, sizes of the light emitting areas EA_W, EA_R, EA_G, and EA_B of the respective sub-pixels SP_W, SP_R, SP_G, and SP_B can be determined on the basis of efficiency of the organic light emitting elements disposed in the respective sub-pixels SP_W, SP_R, SP_G, and SP_B. That is, a size of a light emitting area of a sub-pixel having a relatively low efficiency of an organic light emitting element may be set to be greater than a size of a light emitting area of a sub-pixel having a relatively high efficiency of an organic light emitting element. For example, efficiency of an organic light emitting element is determined by a laminated structure of organic light emitting layers constituting an organic light emitting element, materials of an organic light emitting layer, and the like. If an organic light emitting layers have a low efficiency, life of the organic light emitting layers may be reduced. Thus, by setting a size of a light emitting area of a sub-pixel having a relatively low efficiency of an organic light emitting element to be greater than a size of a light emitting area of a sub-pixel having a relatively high efficiency of an organic light emitting element, life of an organic light emitting display device may be improved. Although FIG. 3 illustrates only driving thin film transistors among various driving elements for driving an organic light emitting element for convenience in explanation, switching thin film transistors or thin film transistors for compensation, or various capacitors may be included in driving elements and disposed in the driving areas DA_R, DA_W, DA_B, and DA_G of the respective sub-pixels SP_R, SP_W, SP_B, and SP_G. Thus, the second lines 370 may include not only data lines but also Vdd lines or Vref lines. If the second lines 370 are of various kinds as such, the second lines 370 for defining the respective sub-pixels SP_R, SP_W, SP_B, and SP_G may be defined as the second lines closest to the left sides and the right sides of the respective sub-pixels SP_R, SP_W, SP_B, and SP_G.

Figure 4:
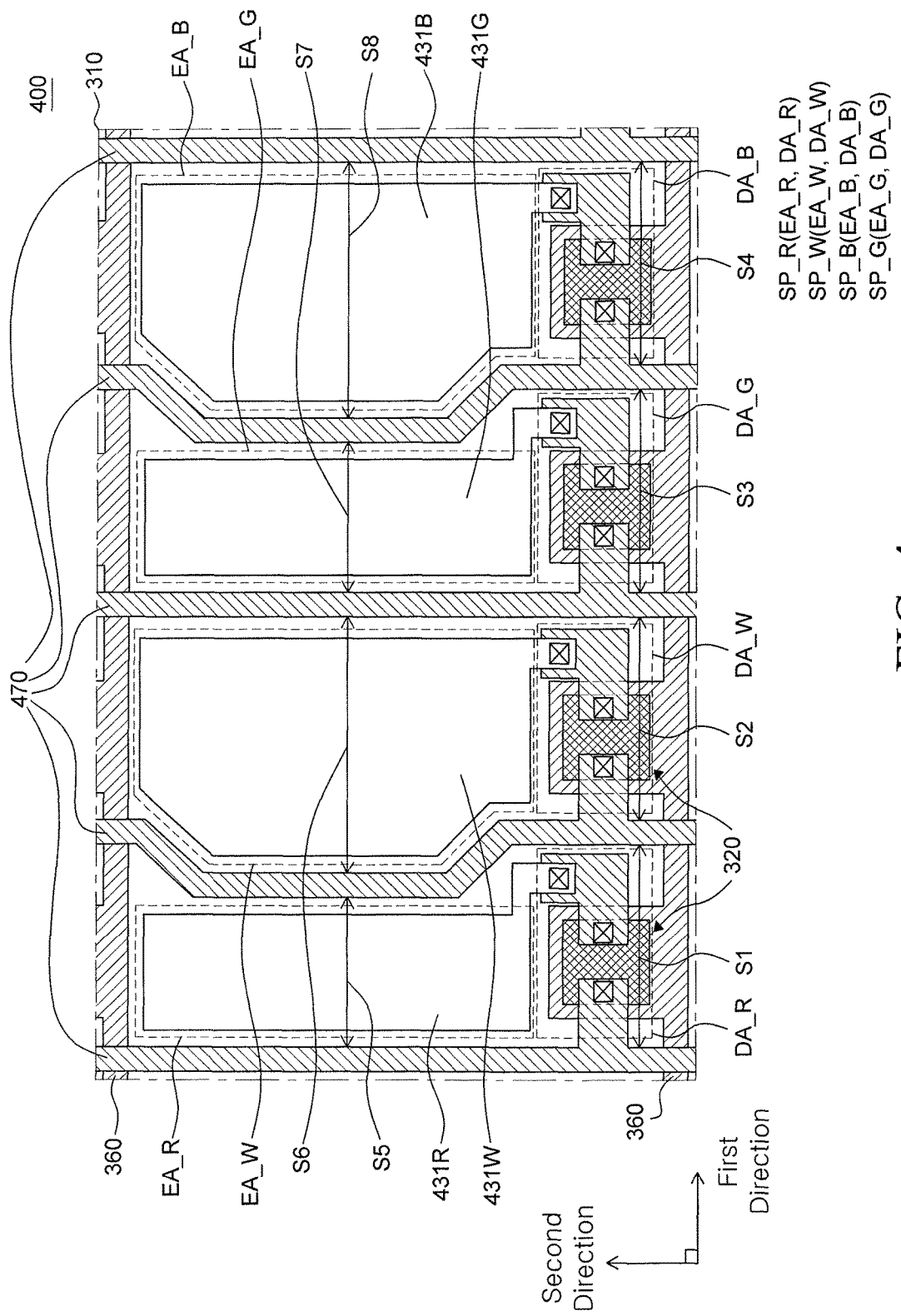
Figure 5:
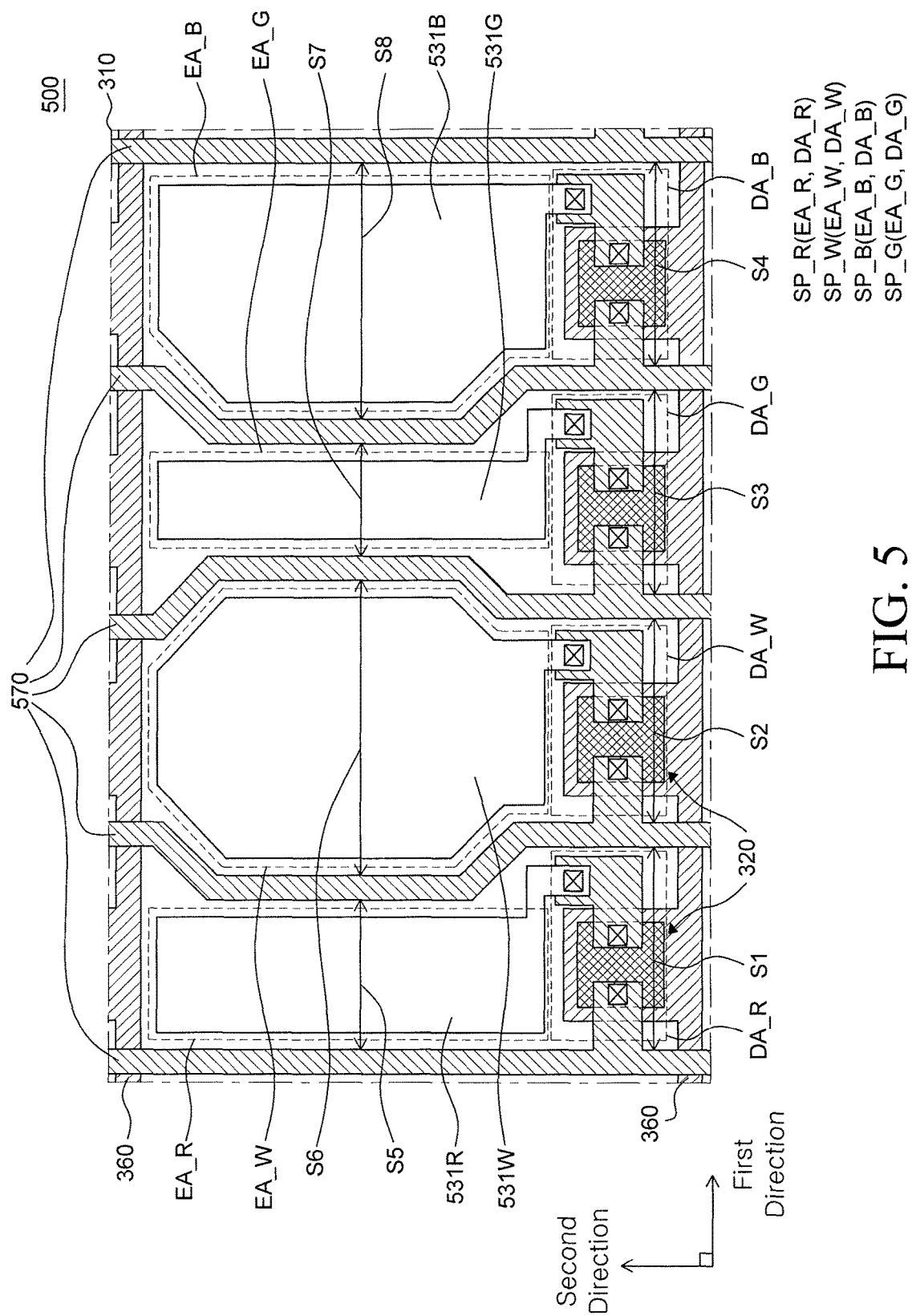

FIG. 4 and FIG. 5 are plane views provided to describe organic light emitting display devices according to various exemplary embodiments of the present invention. As compared with the organic light emitting display device 300 illustrated in FIG. 3, in organic light emitting display devices 400 and 500 illustrated in FIG. 4 and FIG. 5, respectively, positions of blue sub-pixels SP_B and green sub-pixels SP_G, shapes of the second lines 470 and 570, sizes of light emitting areas EA_W of white sub-pixels SP_W, and sizes of area of anodes 431B, 431G, 531W, 531G, and 531B are changed. Thus, redundant explanation of substantially the same components will be omitted.

Referring to FIG. 4 first, a white sub-pixel SP_W and a blue sub-pixel SP_B may not be adjacent to each other, and other sub-pixels SP_R, SP_W, SP_B, and SP_G may be positioned between the white sub-pixel SP_W and the blue sub-pixel SP_B. As illustrated in FIG. 4, a green sub-pixel SP_G may be positioned between the white sub-pixel SP_W and the blue sub-pixel SP_B, and a red sub-pixel SP_R may be positioned between the white sub-pixel SP_W and the blue sub-pixel SP_B. Since the white sub-pixel SP_W and the blue sub-pixel SP_B having relatively large light emitting areas EA_ are disposed so as not to be adjacent to each other, it may be easier to secure sizes of a light emitting area EA_ of the white sub-pixel SP_W and a light emitting area EA_ of the blue sub-pixel SP_B.

Then, referring to FIG. 5, all of second lines 570 defining a light emitting area EA_W of a white sub-pixel SP_W may include slanted portions with respect to a first direction and a second direction. If only the second line 570 positioned at one side of the light emitting area EA_W of the white sub-pixel SP_W is changed, a size of one sub-pixel SP_R, SP_W, SP_B, or SP_G, i.e., a size of a light emitting area EA_R of a red sub-pixel SP_R, needs to be reduced to secure a size of the light emitting area EA_W of the white sub-pixel SP_W. However, there may be a limit in reducing a size of the light emitting area EA_R of the red sub-pixel SP_R.

Therefore, as illustrated in FIG. 5, the size of the light emitting area EA_W of the white sub-pixel SP_W may be further reliably secured by changing shapes of second lines 570 positioned on both sides of the light emitting area EA_W of the white sub-pixel SP_W.

Although FIG. 5 only illustrates an exemplary embodiment in which shapes of the second lines 570 positioned on both sides of the light emitting area EA_W of the white sub-pixel SP_W are changed for convenience in explanation, if necessary, shapes of the second lines 570 positioned on both sides of the light emitting area EA_B of the blue sub-pixel SP_B may be changed together with the second lines 570 positioned on both sides of the light emitting area EA_W of the white sub-pixel SP_W illustrated in FIG. 5.

Figure 6:
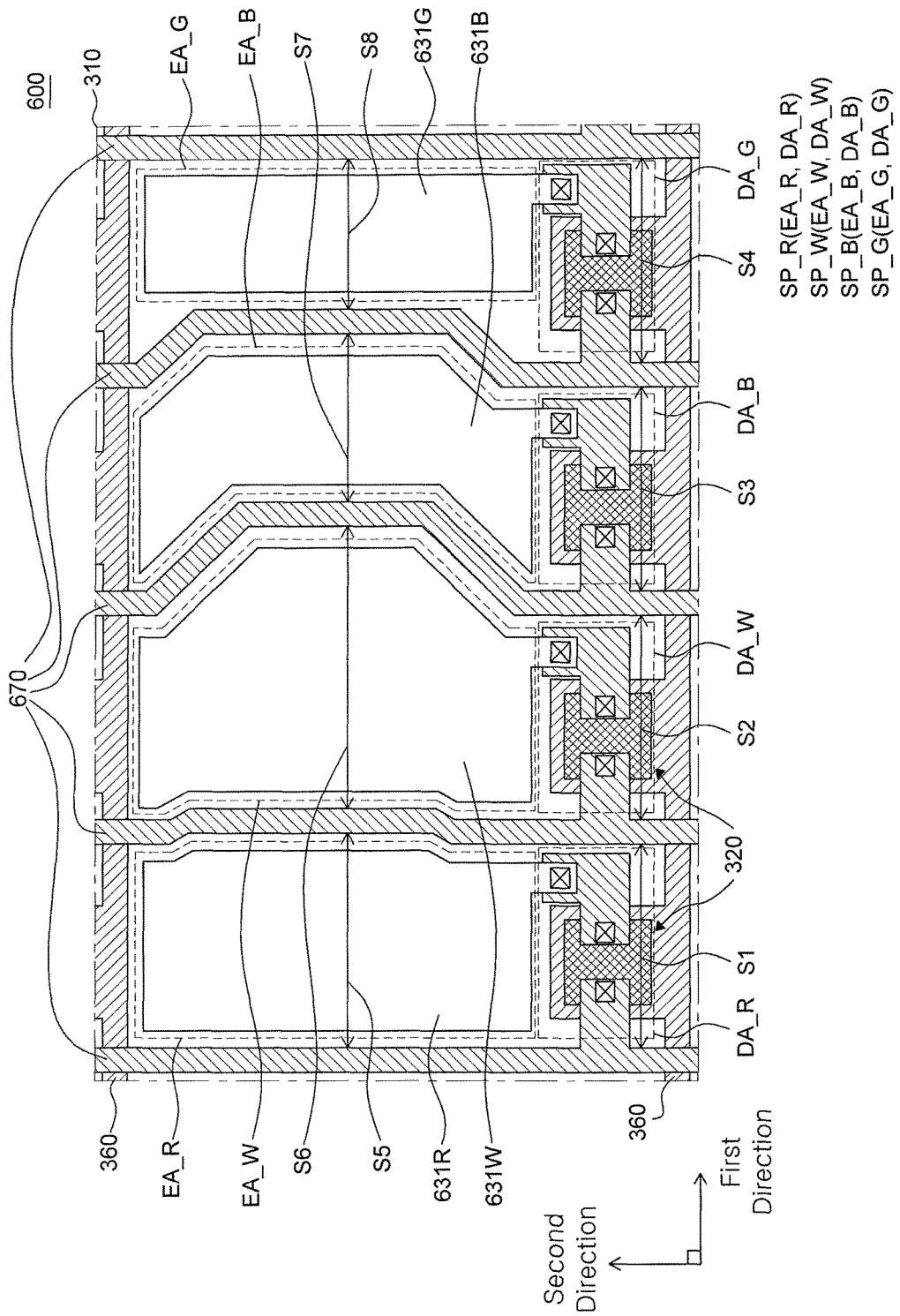

FIG. 6 is a plane view provided to describe an organic light emitting display device according to an exemplary embodiment of the present invention. As compared with the organic light emitting display device 300 illustrated in FIG. 3, in an organic light emitting display device 600 illustrated in FIG. 6, sizes of a red sub-pixel SP_R, a green sub-pixel SP_G, a blue sub-pixel SP_B, and a white sub-pixel SP_W, shapes of second lines 670, and sizes of light emitting areas EA_R, EA_G, EA_B, and EA_W and anodes 631R, 631G, 631B, and 631W of the respective sub-pixel SP_R, green sub-pixel SP_G, blue sub-pixel SP_B, and white sub-pixel SP_W are changed. Thus, redundant explanation of substantially the same components will be omitted.

Referring to FIG. 6, the light emitting area EA_R of the red sub-pixel SP_R includes a portion extending into the white sub-pixel SP_W. That is, among second lines 670 defining the light emitting area EA_R of the red sub-pixel SP_R, a second line 670 disposed between the red sub-pixel SP_R and the white sub-pixel SP_W includes a portion extending into the white sub-pixel SP_W and slanted with respect to a first direction and a second direction.

The light emitting area EA_W of the white sub-pixel SP_W includes a portion extending into the blue sub-pixel SP_B. That is, among second lines defining the light emitting area EA_W of the white sub-pixel SP_W, a second line 670 disposed between the white sub-pixel SP_W and the blue sub-pixel SP_B includes a portion extending into the blue sub-pixel SP_B and slanted portion with respect to the first direction and the second direction. Herein, a degree of a portion extending into the blue sub-pixel SP_B in the second line 670 between the white sub-pixel SP_W and the blue sub-pixel SP_B is larger than a degree a portion extending into the white sub-pixel SP_W in the second line 670 between the red sub-pixel SP_R and the white sub-pixel SP_W.

The light emitting area EA_B of the blue sub-pixel SP_B includes a portion extending into the green sub-pixel SP_G. That is, among second lines defining the light emitting area EA_B of the blue sub-pixel SP_B, a second line 670 disposed between the blue sub-pixel SP_B and the green sub-pixel SP_G includes a portion extending into the green sub-pixel SP_G and slanted portion with respect to the first direction and the second direction. Herein, a degree of a portion extending into the green sub-pixel SP_G in the second line 670 between the blue sub-pixel SP_B and the green sub-pixel SP_G is lower than a degree of a portion extending into the blue sub-pixel SP_B in the second line 670 between the white sub-pixel SP_W and the blue sub-pixel SP_B.

According to the arrangements of the second lines 670 as described above, the light emitting area EA_W of the white sub pixel SP_W has the greatest size. A size of a light emitting area is decreased in sequence from the light emitting area EA_R of the red sub pixel SP_R, the light emitting area EA_B of the blue sub pixel SP_B to the light emitting area EA_G of the green sub pixel SP_G. Thus, by setting the light emitting area EA_W of the white sub pixel SP_W to have a greater size than the light emitting areas EA_R, EA_G, and EA_B of the other sub-pixels SP_R, SP_G, and SP_B, luminance of the organic light emitting display device 600 can be further improved.

Further, for example, if an organic light emitting element disposed on the green sub-pixel SP_G has a relatively high efficiency and an organic light emitting element on the red sub-pixel SP_R has a relatively low efficiency, as illustrated in FIG. 6, a size of the light emitting area EA_R of the red sub-pixel SP_R is increased and a size of the light emitting area EA_G of the green sub-pixel SP_G is decreased, and, thus, life of the organic light emitting display device can be improved.

The arrangements of the sub-pixels SP_R, SP_W, SP_B, and SP_G illustrated in FIG. 3 to FIG. 6 are randomly set for convenience in explanation, and the exemplary embodiments of the present invention are not limited to the arrangements of the sub-pixels SP_R, SP_W, SP_B, and SP_G illustrated in FIG. 3 to FIG. 6. That is, in order to secure a size of the light emitting area EA_B of the blue sub-pixel SP_B and a size of the light emitting area EA_W of the white sub-pixel SP_W, the red sub-pixel SP_R, the white sub-pixel SP_W, the blue sub-pixel SP_B, and the green sub-pixel SP_G may be set within a range in which a portion of the second line 670 can be formed so as to be slanted.

As described above, an aspect of the present invention provides an organic light emitting display device in which each sub-pixel has an optimum size of a light emitting area in a state where a size of a pixel and a size of a driving area are determined on the basis of resolution of the organic light emitting display device. Further, an aperture ratio is secured without making a change in a driving area, and, thus, it is possible to provide an organic light emitting display device improved in reliability of an element. In addition, since a size of a light emitting area of each white sub-pixel is defined to be greater than areas of light emitting areas of the other sub-pixels, and, thus, it is possible to provide an organic light emitting display device improved in life and reliability. Also, since an aperture ratio can be secured, it is possible to provide an organic light emitting display device which is improved in luminance and life that can be applied to a large-screen TV.

It will be apparent to those skilled in the art that various modifications and variations can be made in the organic light emitting display device of the present invention without departing from the spirit or scope of the invention. Thus it is intended that the present invention cover the modifications and variations of this invention provided they come within the scope of the appended claims and their equivalents.

What is claimed is:
1. An organic light emitting display device, comprising:
a plurality of pixels on a substrate;
a plurality of first lines extending in the first direction on the substrate; and
a plurality of second lines intersecting the plurality of first lines and extending in a second direction on the substrate, the second direction being perpendicular to the first direction,
wherein each of the plurality of pixels includes a plurality of sub-pixels,
each of the plurality of sub-pixels includes a light emitting area and a driving area, widths in a first direction of the driving areas of the plurality of sub-pixels are identical to each other, a size of a light emitting area of a first sub-pixel of the plurality of sub-pixels is greater than a size of a light emitting area of a second sub-pixel of the plurality of sub-pixels, a width in the first direction of a light emitting area of the first sub-pixel is greater than a width in the first direction of a light emitting area of the second sub-pixel, and a space between the second lines defining the driving area of the first sub-pixel is smaller than a maximum space between the second lines defining the light emitting area of the first sub-pixel.

2. The organic light emitting display device according to claim 1, wherein a space between the second lines defining the driving area of the second sub-pixel is greater than a minimum space between the second lines defining the light emitting area of the second sub-pixel.

3. The organic light emitting display device according to claim 1, wherein at least one of the second lines defining the first sub-pixel includes a slanted portion with respect to the second direction.

4. The organic light emitting display device according to claim 3, wherein the first sub-pixel is a white sub-pixel or a blue sub-pixel.

5. The organic light emitting display device according to claim 1, wherein the plurality of pixels include a red sub-pixel, a white sub-pixel, a blue sub-pixel, and a green sub-pixel, and wherein the white sub-pixel includes a portion extending toward the red sub-pixel, and the blue sub-pixel includes a portion extending toward the green sub-pixel.

6. The organic light emitting display device according to claim 1, wherein the plurality of pixels include a red sub-pixel, a white sub-pixel, a blue sub-pixel, and a green sub-pixel, and wherein the white sub-pixel includes a portion extending toward the blue sub-pixel, and the blue sub-pixel includes a portion extending toward the green sub-pixel.

7. The organic light emitting display device according to claim 1, wherein the plurality of pixels include a red sub-pixel, a white sub-pixel, a blue sub-pixel, and a green sub-pixel, and wherein the white sub-pixel includes a portion extending toward the red sub-pixel and the green sub-pixel, and the blue sub-pixel includes a portion extending toward the green sub-pixel.

8. The organic light emitting display device according to claim 1, wherein the plurality of pixels include a red sub-pixel, a white sub-pixel, a blue sub-pixel, and a green sub-pixel, and wherein the white sub-pixel includes a portion extending toward the blue sub-pixel, the blue sub-pixel includes a portion extending toward the green sub-pixel, and the red sub-pixel includes a portion extending toward the white sub-pixel.

9. The organic light emitting display device according to claim 1, wherein the plurality of pixels include a red sub-pixel, a white sub-pixel, a blue sub-pixel, and a green sub-pixel, and wherein the red sub-pixel is adjacent to the white sub-pixel, the white sub-pixel is adjacent to the blue sub-pixel, and the blue sub-pixel is adjacent to the green sub-pixel.

10. The organic light emitting display device according to claim 1, wherein the plurality of sub-pixels include a red sub-pixel, a white sub-pixel, a blue sub-pixel, and a green sub-pixel, and wherein the red sub-pixel is adjacent to the white sub-pixel, the white sub-pixel is adjacent to the green sub-pixel, and the green sub-pixel is adjacent to the blue sub-pixel.

11. The organic light emitting display device according to claim 1, wherein the plurality of pixels include a red sub-pixel, a white sub-pixel, a blue sub-pixel, and a green sub-pixel, and the second lines defining the driving area of the red sub-pixel, the driving area of the white sub-pixel, the driving area of the blue sub-pixel, and the driving area of the green sub-pixel are equally spaced apart.

12. An organic light emitting display device, comprising:

a plurality of pixels on a substrate, wherein each of the plurality of pixels includes a plurality of sub-pixels, each of the plurality of sub-pixels includes a light emitting area and a driving area, widths in a first direction of the driving areas of the plurality of sub-pixels are identical to each other, and a size of a light emitting area of a first sub-pixel of the plurality of sub-pixels is greater than a size of a light emitting area of a second sub-pixel of the plurality of sub-pixels, wherein the plurality of sub-pixels include a red sub-pixel, a white sub-pixel, a blue sub-pixel, and a green sub-pixel, and the blue sub-pixel or the white sub-pixel is a first sub-pixel, and the red sub-pixel or the green sub-pixel is a second sub-pixel, and wherein the white sub-pixel includes a portion extending toward the blue sub-pixel, the blue sub-pixel includes a portion extending toward the green sub-pixel, and the red sub-pixel includes a portion extending toward the white sub-pixel.

13. The organic light emitting display device according to claim 12, further comprising:

a plurality of first lines extending in the first direction on a substrate; and a plurality of second lines intersecting the plurality of first lines and extending in a second direction on the substrate, the second direction being perpendicular to the first direction.

14. The organic light emitting display device according to claim 13, wherein a space between the second lines defining the driving area of the blue sub-pixel is smaller than a maximum space between the second lines defining the light emitting area of the blue sub-pixel, and a space between the second lines defining the driving area of the white sub-pixel is smaller than a maximum space between the second lines of the light emitting area of the white sub-pixel.

15. The organic light emitting display device according to claim 13, wherein a space between the second lines defining the driving area of the red sub-pixel is greater than a minimum space between the second lines defining the light emitting area of the red sub pixel, and a space between the second lines defining the driving area of the green sub-pixel is greater than a minimum space between the second lines of the light emitting area of the green sub-pixel.

16. The organic light emitting display device according to claim 13,
wherein at least one of the second lines defining the white sub-pixel or the blue sub-pixel includes a slanted portion with respect to the second direction.

17. The organic light emitting display device according to claim 12,
wherein the size of the light emitting area of the white sub-pixel is greater than the size of the light emitting area of the red sub-pixel, the size of the light emitting area of the blue sub-pixel, and the size of the light emitting area of the green sub-pixel, respectively.

18. The organic light emitting display device according to claim 12,
wherein the size of the light emitting area of the white sub-pixel or the size of the light emitting area of the blue sub-pixel is greater than the size of the light emitting area of the red sub-pixel or the size of the light emitting area of the green sub-pixel.

19. The organic light emitting display device according to claim 12,
wherein the red sub-pixel is adjacent to the white sub-pixel, the white sub-pixel is adjacent to the blue sub-pixel, and the blue sub-pixel is adjacent to the green sub-pixel.

20. The organic light emitting display device according to claim 12,
wherein the red sub-pixel is adjacent to the white sub-pixel, the white sub-pixel is adjacent to the green sub-pixel, and the green sub-pixel is adjacent to the blue sub-pixel.

21. A display device comprising:
an array of pixels with each pixel having sub-pixels, each of the sub-pixels divided into a light emitting area having an organic light emitting element and a driving area having driving elements that drive the organic light emitting element;
a plurality of first lines extending in the first direction; and
a plurality of second lines intersecting the plurality of first lines and extending in a second direction on the substrate, the second direction being perpendicular to the first direction,
wherein each of the sub-pixels is configured to have a particular aperture ratio, which is optimized in view of the driving area having a prescribed size, in consideration of each of the pixels having a prescribed size to achieve a specific resolution for the display device,
wherein a space between the second lines defining the driving area of the first sub-pixel is smaller than a maximum space between the second lines defining the light emitting area of the first sub-pixel,
wherein the particular aperture ratio is optimized by configuring at least a portion of a width of a particular sub-pixel in each of the pixels to be greater than that of another sub-pixel in that pixel, and
wherein the greater width of the particular sub-pixel results in at least one portion of a data line of the second lines, passing along an edge of the particular sub-pixel, being bent away from a lengthwise direction of the entire data line.

22. The display device of claim 21, wherein the particular aperture ratio for respective sub-pixels in each of the pixels are achieved without making changes to the prescribed size of each of the pixels and the prescribed size of the driving area of the respective sub-pixels.

23. The display device of claim 21, wherein the size of each driving area for each of the sub-pixels is identical to one another.

24. The display device of claim 23, wherein the size of the emitting area of each of the sub-pixels is based upon a current required for that sub-pixel or an efficiency of the organic light emitting element in that sub-pixel.

25. The display device of claim 12, wherein the white sub-pixel includes a portion extending toward the red sub-pixel, and the blue sub-pixel includes a portion extending toward the green sub-pixel.

26. The display device of claim 12, wherein the white sub-pixel includes a portion extending toward the red sub-pixel and the green sub-pixel, and the blue sub-pixel includes a portion extending toward the green sub-pixel.

* * * * *